(12) United States Patent
Wang

(10) Patent No.: US 8,535,496 B2
(45) Date of Patent: Sep. 17, 2013

(54) SPUTTER-COATING APPARATUS

(75) Inventor: Chung-Pei Wang, Tucheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 808 days.

(21) Appl. No.: 12/648,014

(22) Filed: Dec. 28, 2009

(65) Prior Publication Data

US 2010/0213053 A1 Aug. 26, 2010

(51) Int. Cl.
*C23C 14/00* (2006.01)

(52) U.S. Cl.
USPC ............ 204/298.27; 204/298.15; 204/298.23; 204/298.26; 204/298.28

(58) Field of Classification Search
USPC ............. 204/298.26, 298.28, 298.15, 298.23, 204/298.27
See application file for complete search history.

(56) References Cited

U.S. PATENT DOCUMENTS

| | | | | | |
|---|---|---|---|---|---|
| 3,576,729 | A | * | 4/1971 | Sigournay et al. | 204/192.11 |
| 3,652,443 | A | * | 3/1972 | Fish et al. | 204/298.11 |
| 4,411,763 | A | * | 10/1983 | Itaba et al. | 204/298.06 |
| 4,548,698 | A | * | 10/1985 | Sellschopp | 204/298.11 |
| 4,798,663 | A | * | 1/1989 | Herklotz et al. | 204/298.06 |
| 6,471,837 | B1 | * | 10/2002 | Hans et al. | 204/298.41 |
| 2005/0115822 | A1 | * | 6/2005 | Maass et al. | 204/192.2 |

* cited by examiner

*Primary Examiner* — John Brayton
(74) *Attorney, Agent, or Firm* — Altis Law Group, Inc.

(57) ABSTRACT

A sputter-coating apparatus is configured for forming coatings on a plurality of workpieces, and includes a deposition chamber defining a cavity, a plurality of targets received in the cavity, and a plurality of supporting assemblies. Each target includes a first target plate and an opposite second target plate. The supporting assemblies are received in the cavity and arranged between the first target plates and the second target plates. Each supporting assembly includes a hollow rotating post for rotating about a first axis substantially parallel to a lengthwise direction thereof, at least one support extending from the post, and at least one driving unit. Each support includes a connecting arm rotatably connected to the post and a fixing portion attached to the connecting arm for supporting a workpiece. The driving unit is configured for driving each connecting arm to rotate relative to the corresponding post about a second axis.

14 Claims, 5 Drawing Sheets

SPUTTER-COATING APPARATUS

BACKGROUND

1. Technical Field

The present disclosure relates to coating technologies, and particularly to a sputter-coating apparatus.

2. Description of Related Art

Generally, during sputter-coating of a plurality of workpieces such as cell phone housings, an inert gas is excited in a sputter-coating chamber to release energized ions. The energized ions bombard a solid target material to vaporize the material. The vaporized material is then deposited on the workpieces. However, the workpieces may include some curved portions and are typically stationary during coating. This can result in non-uniform coating of vaporized material.

Therefore, what is needed is a sputter-coating apparatus which can overcome the limitations described above.

DETAILED DESCRIPTION

Figure 1:
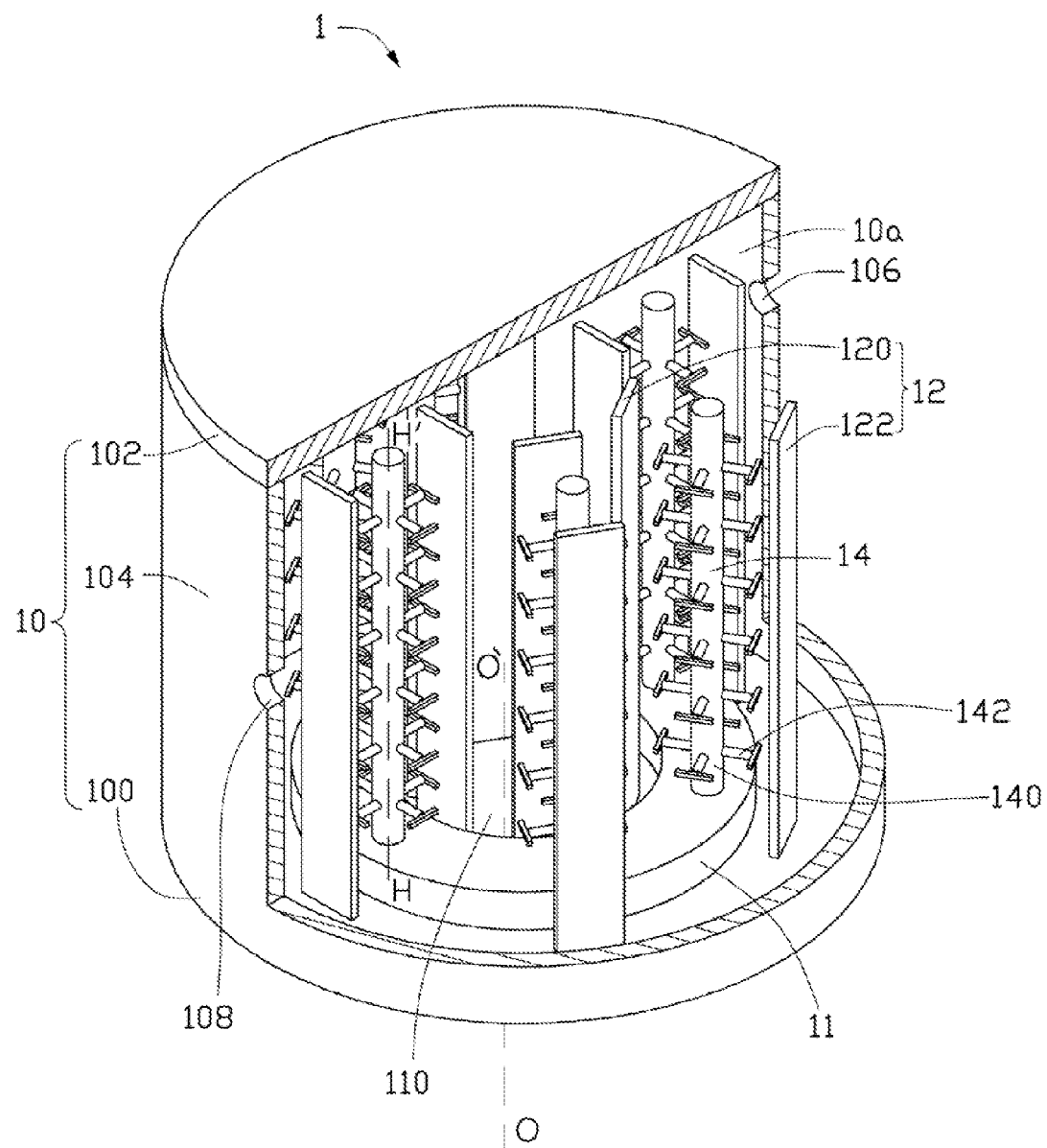
FIG. 1 is a cutaway view of a sputter-coating apparatus, according to a first exemplary embodiment.

The components of the drawings are not necessarily drawn to scale, the emphasis instead being placed upon clearly illustrating the principles of the embodiments of the sputter-coating apparatus. Moreover, in the drawings, like reference numerals designate corresponding parts throughout several views.

Referring to FIG. 1, a sputter-coating apparatus 1 for forming coatings on a plurality of workpieces (not shown), according to a first exemplary embodiment, includes a deposition chamber 10 defining a cavity 10a therein, a rotating base 11, six targets 12, and six supporting assemblies 14. The rotating base 11, the six targets 12, and the six supporting assemblies 14 are received in the cavity 10a.

The deposition chamber 10 includes a bottom panel 100, a top panel 102 opposite to the bottom panel 100, and a sidewall 104 connecting the bottom panel 100 to the top panel 102. A gas inlet 106 and a gas outlet 108 are defined in the sidewall 104. The gas inlet 106 admits an inert gas into the cavity 10a. A vacuum pump (not shown) is connected to the gas outlet 108 for evacuating gaseous contents from the cavity 10a.

The rotating base 11 has a center axis OO'. In this embodiment, the rotating base 11 is an annular planar plate defining a through hole 110 at a center thereof. It is understood that the rotating base 11 can be a circular planar plate in a second exemplary embodiment (shown in FIG. 3).

Figure 3:
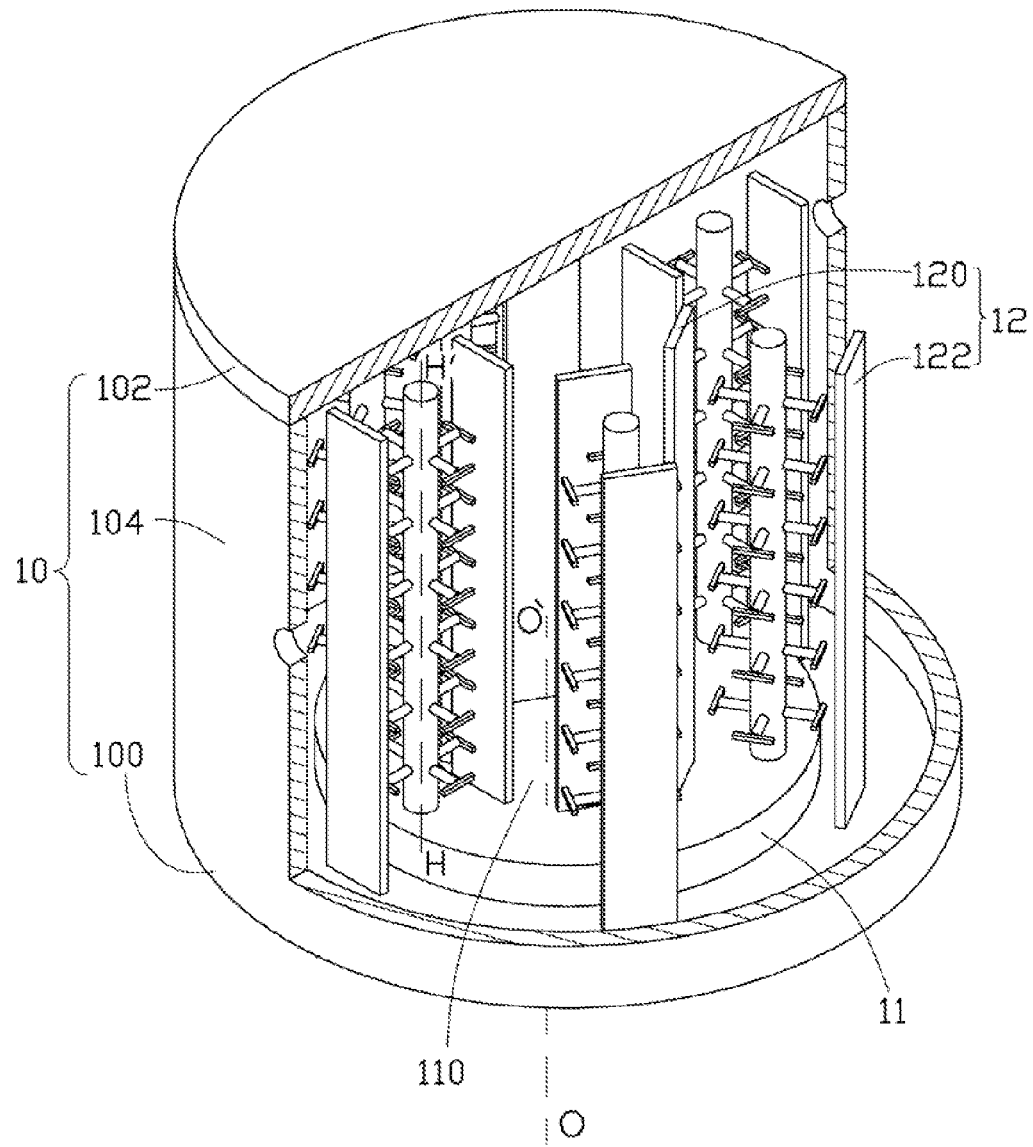
FIG. 3 is a cutaway view of a sputter-coating apparatus, according to a second exemplary embodiment.
Figure 4:
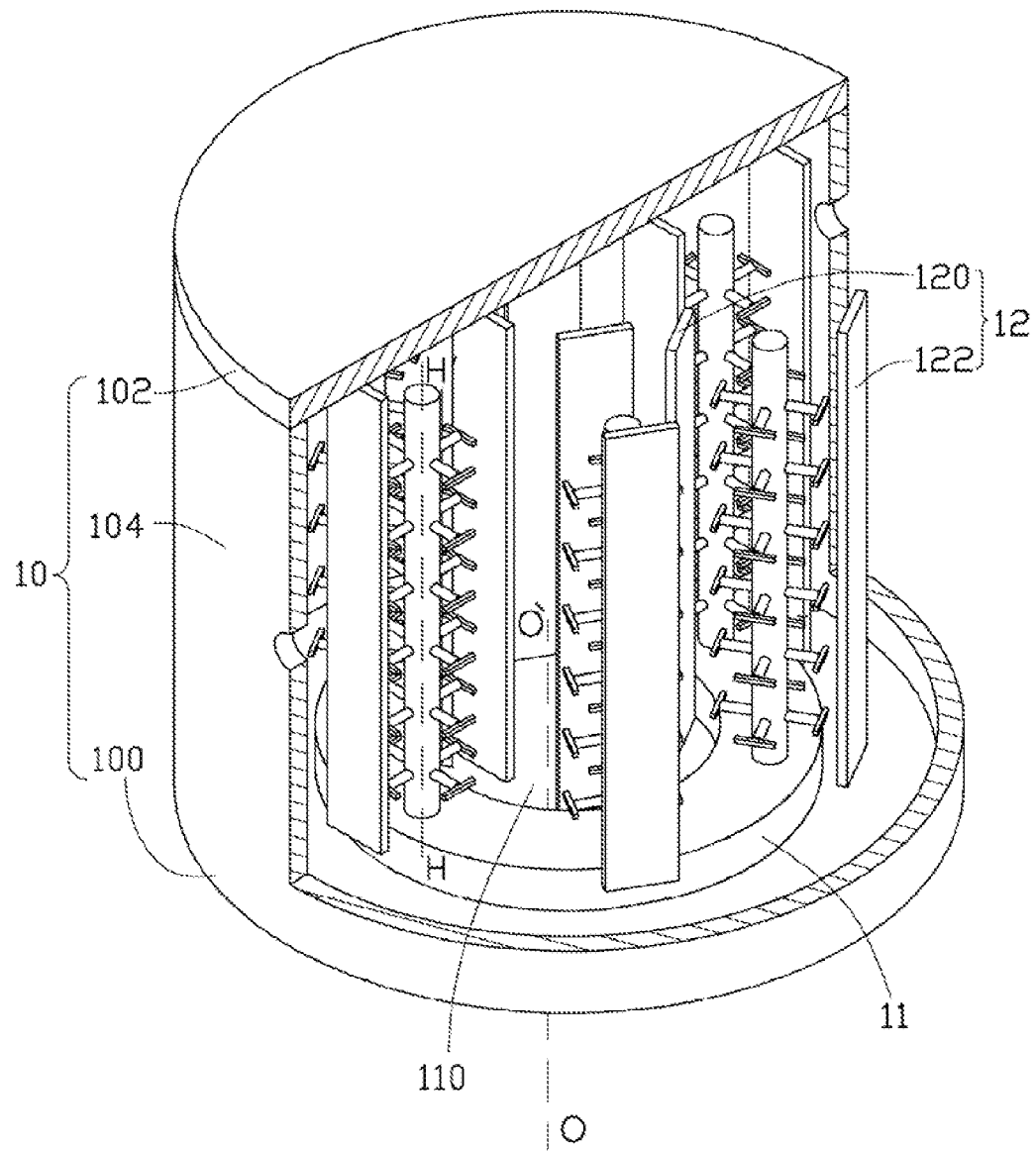
FIG. 4 is a cutaway view of a sputter-coating apparatus, according to a third exemplary embodiment.
Figure 5:
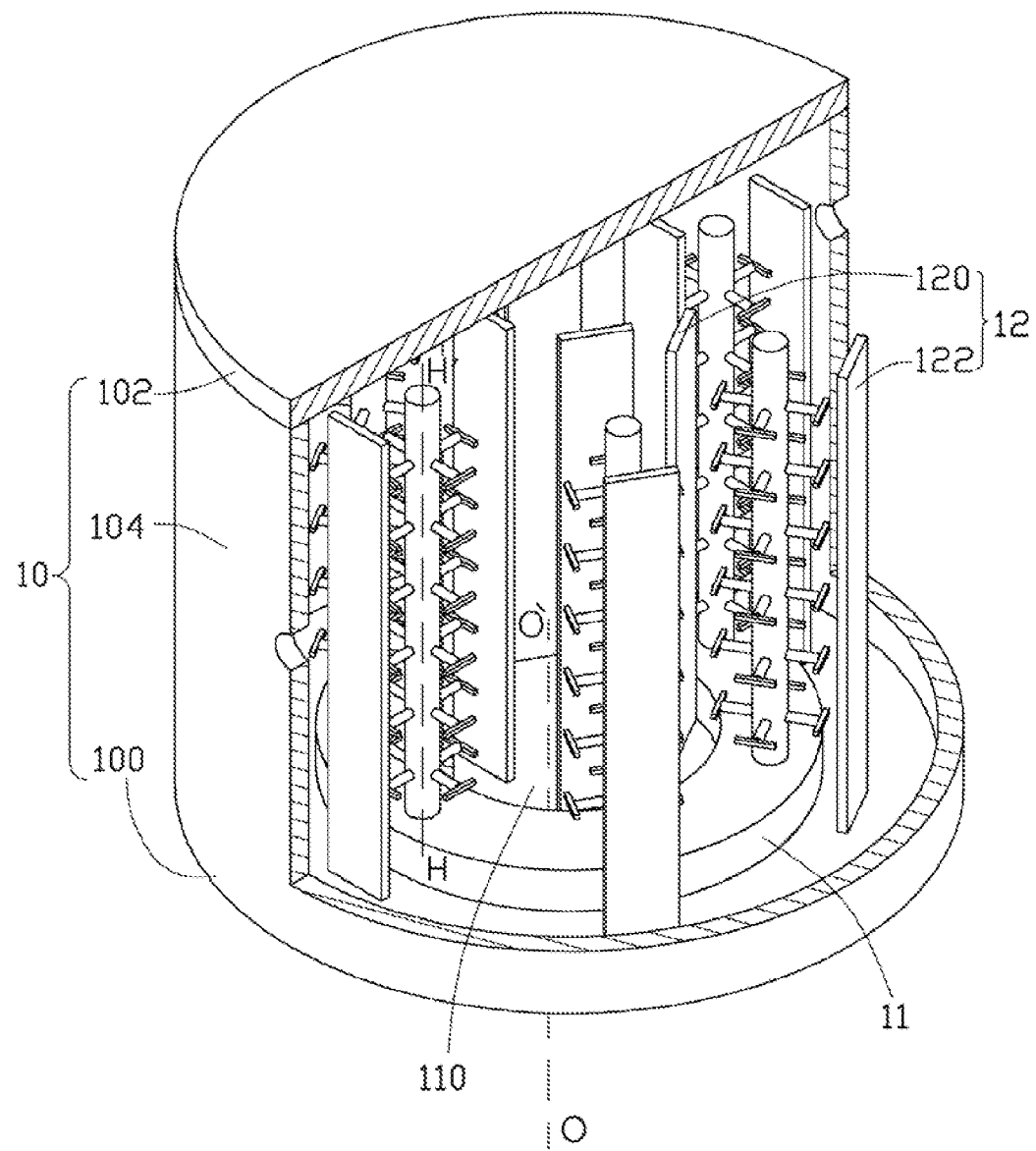
FIG. 5 is a cutaway view of a sputter-coating apparatus, according to a fourth exemplary embodiment.

Each target 12 includes a first target plate 120 and a second target plate 122 opposite to the first target plate 122. The first target plates 120 are fixed on the bottom panel 100 on an imaginary circle and pass through the through hole 110. The second target plates 122 are fixed on the bottom panel 100 and spatially corresponding to the first target plates 120. The second target plates 122 surround the rotating base 11. Referring to FIG. 4, in a third exemplary embodiment, the first target plates 120 are fixed on the top panel 102, and the second target plates 122 are fixed on the top panel 102. Referring to FIG. 5, in a fourth exemplary embodiment, the first target plates 120 are fixed on the top panel 102, and the second target plates 122 are fixed on the bottom panel 100. Referring to FIG. 3, if the rotating base 11 is a circular planar plate, the first target plates 120 are fixed on the rotating base 11 and rotatable jointly with the rotating base 11.

Figure 2:
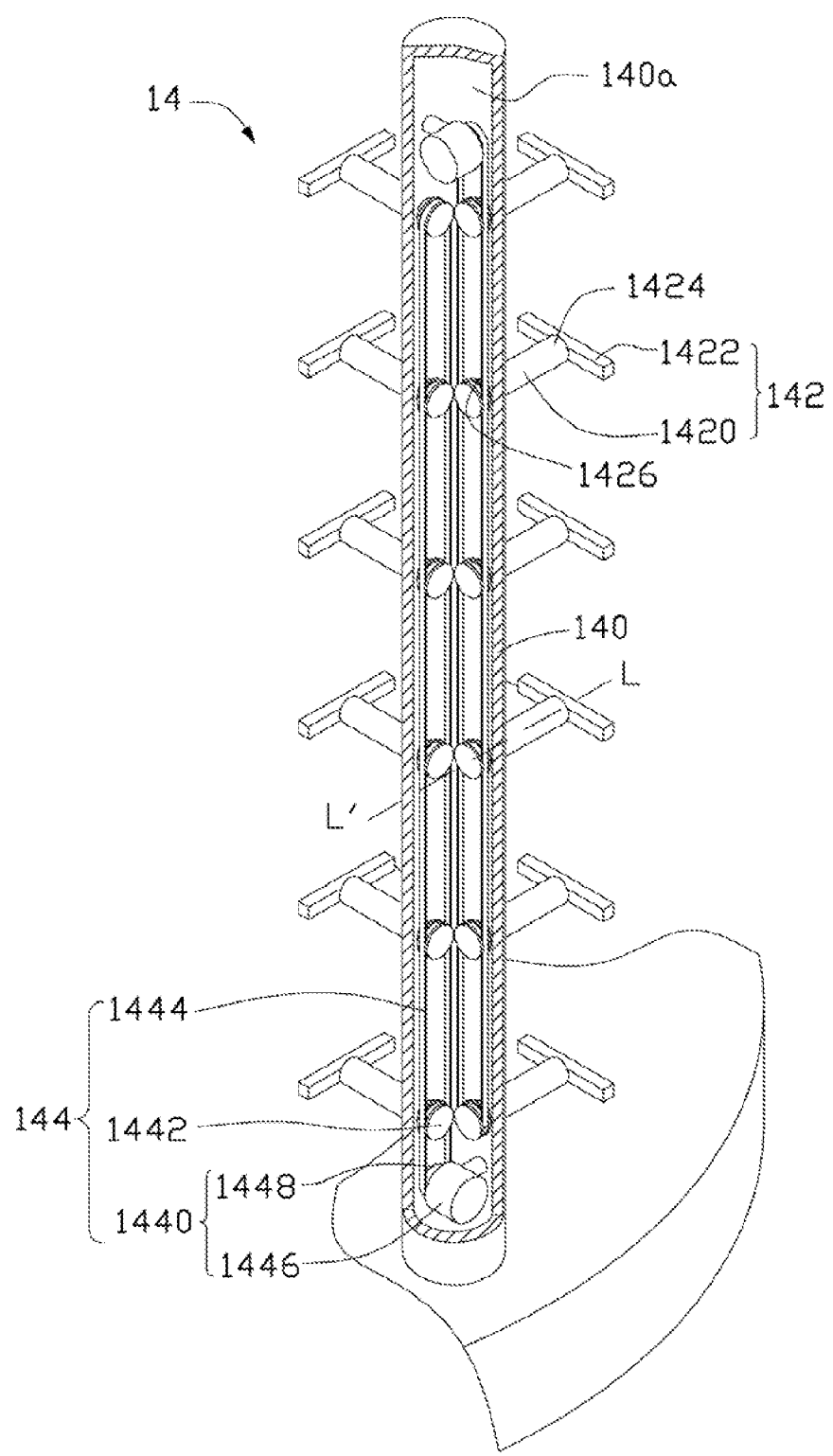
FIG. 2 is a partially enlarged, cutaway view of a supporting assembly of the sputter-coating apparatus of FIG. 1.

Referring to FIG. 1 together with FIG. 2, the six supporting assemblies 14 are fixed on the rotating base 11 and arranged between the first target plates 120 and the second target plates 122. Each supporting assembly 14 includes a hollow cylindrical rotating post 140 for rotating about a first axis HH' substantially parallel to a lengthwise direction thereof, twenty-four supports 142 extending from the post 140, and four driving units 144 entirely received in the post 140. Each rotating post 140 defines a chamber 140a therein.

Every four supports 142 radially extend from an outer circumference surface of the post 140. Every six supports 142 are equidistantly spaced from each other and arranged in rows along the first axis HH' associated with the post 140 so that four rows of supports 142 are formed in each post 140 along the first axis HH'.

Each support 142 includes a connecting arm 1420 and a fixing portion 1422. The connecting arm 1420 is rotatably connected to the post 140. The connecting arm 1420 includes a first end 1424 outside the post 140 and a second end 1426 received in the chamber 140a. The fixing portion 1422 is fixed to the first end 1424 by adhesive and is configured for supporting a workpiece.

Each driving unit 144 is entirely received in the chamber 140a and corresponds to a row of supports 142 along the first axis HH'. Each driving unit 144 includes a driving member 1440, six rotating members 1442 and a belt 1444. The six rotating members 1442 are fixed to the second ends 1426 in the same row. In particular, the driving member 1440 is a motor including a stator 1446 fixed to an inner circumference surface of the post 140 and a rotor 1448 extending from the stator 1446. The belt 1444 is wrapped around the rotor 1448 and the six rotating members 1442. The rotating members 1442 are fixed to the second ends 1426 by screwing. The driving member 1440 is configured for driving the belt 1444 to rotate. The rotating members 1442 is driven to rotate by the rotation of the belt 1444, and the connecting arms 1420 are driven to rotate by the rotation of the rotating members 1442 relative to the post 140 about a second axis LL' substantially parallel to a lengthwise direction thereof. In this embodiment, the second axis LL' is substantially perpendicular to the first axis HH'.

When the inert gas is excited to release energized ions, the energized ions bombard the six targets 12 to vaporize the material. The supporting assemblies 14 rotate about the center axis OO' with the rotation of the rotating base 11, the posts 140 can rotate about the first axis HH' between the first target plates 120 and the second target plates 122. The connecting arms 1420 rotate about the second axis LL' with the rotation of the rotating members 1442 relative to the post 140. In particular, the rotation direction of the supporting assemblies 14 about the center axis OO' is contrary to that of the post 140. The rotation directions of the two adjacent connecting arms 1420 on the same planes orthogonal to the first axis HH' are contrary to each other. As a result, vaporized material coating of the workpieces is uniform.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A sputter-coating apparatus for forming coatings on a plurality of workpieces, comprising:
   a deposition chamber defining a cavity;
   a plurality of targets received in the cavity, each target comprising a first target plate and a second target plate opposite to the first target plate; and
   a plurality of supporting assemblies each respectively received in the cavity arranged between the first target plates and the second target plates, wherein each supporting assembly comprises:
   a hollow cylindrical rotating post for rotating about a first axis substantially parallel to a lengthwise direction thereof, the post defining an interior chamber;
   at least one support radially extending from an outer circumferential surface of the post, each support comprising a connecting arm rotatably connected to the post and a fixing portion attached to the connecting arm for supporting a workpiece; and
   at least one driving unit entirely received in the interior chamber and configured for driving each connecting arm to rotate relative to the post about a second axis.

2. The sputter-coating apparatus as claimed in claim 1, wherein the second axis is substantially perpendicular to the first axis.

3. The sputter-coating apparatus as claimed in claim 1, wherein the sputter-coating apparatus comprises a rotating base defining a center axis; the first target plates are received in the deposition chamber and arranged on an imaginary circle, the second target plates are fixed to the deposition chamber and the second target plates surround the rotating base.

4. The sputter-coating apparatus as claimed in claim 3, wherein the rotating base is a circular planar plate, and the first target plates are fixed on the rotating base and rotatable jointly with the rotating base.

5. The sputter-coating apparatus as claimed in claim 3, wherein the rotating base is an annular planar plate defining a through hole, the first target plates are fixed to the deposition chamber corresponding to the through hole, and the supporting assemblies are rotatable jointly with the rotating base relative to the first and second target plates.

6. The sputter-coating apparatus as claimed in claim 5, wherein the deposition chamber comprises a bottom panel, a top panel opposite to the bottom panel, and a sidewall connecting the bottom panel to the top panel; a gas inlet and a gas outlet are defined in the sidewall; the gas inlet is configured for introducing an inert gas into the cavity; and a vacuum pump is mounted to the gas outlet and is configured for evacuating gaseous content from the cavity.

7. The sputter-coating apparatus as claimed in claim 6, wherein the first target plates are fixed on the top panel and pass through the through hole, and the second target plates are fixed on the top panel.

8. The sputter-coating apparatus as claimed in claim 6, wherein the first target plates are fixed on the top panel and pass through the through hole, and the second target plates are fixed on the bottom panel.

9. The sputter-coating apparatus as claimed in claim 6, wherein the first target plates are fixed on the bottom panel and pass through the through hole, and the second target plates are fixed on the bottom panel.

10. The sputter-coating apparatus as claimed in claim 3, wherein each supporting assembly comprises a plurality of supports radially extending from an outer circumferential surface of the post, and the supports are equidistantly spaced from each other and arranged in rows along the first axis associated with the post.

11. The sputter-coating apparatus as claimed in claim 10, wherein each supporting assembly comprises a plurality of driving units received in the interior chamber and configured for driving the supports in the respective rows to rotate about the second axis.

12. The sputter-coating apparatus as claimed in claim 11, wherein each driving unit comprises a driving member fixed to an inner circumferential surface of the post, a plurality of rotating members fixed to the connecting arms in the same row, and a belt wrapped around the rotating members and the driving member; and wherein the driving member is configured for driving the belt to rotate; the rotating members are driven to rotate by the rotation of the belt, and the connecting arms are driven to rotate by the rotation of the rotating members.

13. The sputter-coating apparatus as claimed in claim 12, wherein the driving member comprises a motor, the motor comprises a stator fixed to the inner circumferential surface of the post and a rotor extending from the stator, and the belt is wrapped around the rotor.

14. The sputter-coating apparatus as claimed in claim 12, wherein each connecting arm comprises a first end outside the post and a second end received in the interior chamber, the fixing portion is fixed to the corresponding first end, and the rotating member is fixed to the corresponding second end.

* * * * *